United States Patent [19]
Herlein et al.

[11] Patent Number: 5,430,400
[45] Date of Patent: Jul. 4, 1995

[54] DRIVER CIRCUITS FOR IC TESTER

[75] Inventors: Richard F. Herlein, San Jose; Sergio A. Sanielevici, Los Altos; Burnell G. West, Fremont; David K. Cheung, Milpitas, all of Calif.

[73] Assignee: Schlumberger Technologies Inc., San Jose, Calif.

[21] Appl. No.: 100,975

[22] Filed: Aug. 3, 1993

[51] Int. Cl.⁶ .................... H03K 3/01; H03K 19/00
[52] U.S. Cl. ........................... 327/108; 327/407; 327/484
[58] Field of Search ............ 307/243, 255, 270, 475, 307/571, 572, 570, 357; 328/106, 154

[56] References Cited

U.S. PATENT DOCUMENTS

| | | | |
|---|---|---|---|
| 4,814,638 | 3/1989 | Weick | 307/270 |
| 4,954,729 | 9/1990 | Urai | 307/572 |
| 4,972,157 | 11/1990 | Moyal | 307/243 |
| 5,245,230 | 9/1993 | Ohri et al. | 307/572 |

OTHER PUBLICATIONS

M. Barber, *Subnanosecond timing measurements on MOS devices using modern VLSI test systems*, International Test Conference, 1983, paper 8.1, pp. 170–180.
B. West, *Attainable accuracy of autocalibrating VLSI test systems*, International Test Conference, 1983, paper 8.4, pp. 193–199.

Primary Examiner—Steven L. Stephan
Assistant Examiner—Shawn Riley
Attorney, Agent, or Firm—Kenneth Olsen; Keith G. W. Smith; Bruce D. Riter

[57] ABSTRACT

Driver circuits are provided which also serve as termination and clamp in an IC tester. When it is to drive a port of a device under test (DUT) between two predetermined voltage levels, the driver's I/O terminal is switched between two predetermined voltage levels with an output impedance that matches the transmission line between the driver circuit and the DUT. When the DUT's port is supplying an output signal, the driver circuit can be programmed to provide one of two types of termination. If the DUT's port is specified as capable of driving the load, the transmission line between the driver circuit and the DUT is terminated by switching the driver circuit's I/O terminal to a predetermined voltage level with an impedance of $Z_0$. If the DUT's port is not specified as being capable of driving such a termination load, the driver circuit functions like a Z-clamp circuit.

7 Claims, 5 Drawing Sheets

R + Rd = Ro

R + Rd = Ro

DRIVER CIRCUITS FOR IC TESTER

BACKGROUND OF THE INVENTION

1. Field of the Invention

The present invention relates to remote automatic testers used in dynamic testing of integrated circuits and, in particular, to driver circuits for use in such testers.

2. The Prior Art

The dynamic operating characteristics of an integrated circuit (IC), such as switching speed and propagation delay time, are typically determined using an automatic tester. For example, the tester may be programmed to transmit a sequence of test signals to various input or input/output (I/O) ports of a device under test (DUT), such as an IC, and to measure the resulting output levels and response times of the DUT. Such testing may determine whether the DUT functions properly and also determine the required timing characteristics of the circuitry that will be connected to the input, output, and I/O ports of the DUT after the testing process is complete.

Since the tester must generate DUT input signals and measure the output response signals of the DUT to accuracies approaching plus-or-minus 100 picoseconds, the tester must be constructed so that it will not distort the waveforms of the output signals of the DUT, or at least so that it will distort these waveforms only in ways that are predictable and repeatable.

Each DUT output signal must pass through a transmission line which connects the DUT port to a comparator within the tester. This transmission line should be terminated in its characteristic impedance ($Z_0$) if the DUT is capable of driving such a load, or by a "Z-clamp" circuit as described below.

Each I/O port of the DUT must also be connected to a driver circuit within the tester. To minimize the load that the tester applies to the DUT output, the driver and comparator are generally connected to the DUT via a single transmission line. This method of connection requires that the driver be located at the end of the transmission line, very close to the termination circuitry. Any physical separation between the driver and the termination circuitry can cause timing errors in two ways. First, the driver's output signal path can include a transmission line stub which introduces reflections and distorts the driver's output waveform. Second, the output capacitance of the turned-off driver can distort the output waveform of the DUT by causing reflections in the DUT output-signal path.

A typical prior-art driver exhibits the following problems:

1. It requires a separate circuit for terminating or clamping the transmission line between itself and the DUT. This terminator or clamp must necessarily be some finite distance from the driver, resulting in a transmission line stub.

2. It does not have an adequate "turned-off" state, so that when the DUT attempts to drive the driver's output high or low, the driver will produce an output current that tends to make the transition slower.

3. When driving to a digital "high" level, it does not adequately sink the current that impinges on it as a result of transmission line reflections that try to drive its output to a more positive level.

4. When driving to a digital "low" level, it does not adequately sink the current that impinges on it as a result of transmission line reflections that try to drive its output to a more negative level.

Improperly terminated transmission lines in the test environment can cause significant time-measurement errors, especially when CMOS devices being tested generate narrow pulses. As the clock speed of digital CMOS devices increases to 100 MHz and beyond, the problem of I/O errors caused by transmission line aberrations on the device interconnections becomes much more severe.

End-users typically eliminate this problem by packaging the devices in multi-chip modules to reduce the interconnection distances. However, transmission line aberrations are not easily eliminated in the test environment, since the physical separation between the device under test (DUT) and the tester's driver and comparator circuits is usually an order of magnitude greater than the minimum interconnection distances in a multi-chip module. Inappropriate termination of transmission lines in a test system significantly detracts from the timing and voltage accuracy specifications of the tester's comparator performance.

Clamping Techniques. Known techniques for terminating the transmission lines in a test system include the "hard clamp", the "Z-clamp", source-terminating the lines in their characteristic impedance ($Z_0$), terminating the tester ends of the lines in their characteristic impedance, and the programmable load.

A further technique, suggested by Barber (M. R. BARBER, Subnanosecond timing measurements on MOS devices using modern VLSI test systems, INTERNATIONAL TEST CONFERENCE, 1983) and others, is to place the tester's comparators very close to the DUT. This has the significant advantage of minimizing differences between the test environment and the end-use environment. A significant disadvantage is that, in order to handle DUT I/O pins, the tester's drivers would also have to be placed very close to the DUT. To date, no one has built such a system in a cost-effective manner.

If the output impedance of the DUT is less than the characteristic impedance of the transmission line, and if the tester end of the transmission line is left open, then the voltage transitions seen by the comparator in the tester are different from the voltage transitions generated by the DUT. A single edge generated by the DUT is observed to overshoot and then ring. Subsequent edges are observed as being superimposed on the ringing caused by previous edges. Timing errors occur if the DUT output edges are not separated by several times the propagation delay of the transmission line. Even invalid-data errors can occur if the DUT output edge rate is high enough.

However, most existing CMOS output drivers are not designed to drive a terminated transmission line. Thus, alternate approaches must be used in the test setup to minimize transmission line ringing and the resulting timing (and possibly data) errors.

The "Hard Clamp". This circuit consists of two Schottky diodes and two voltage sources. One diode is connected between the input and the positive clamp voltage; the other diode is connected between the input and the negative clamp voltage. The magnitudes of the clamp voltages are typically adjusted to be equal to (or a few hundred millivolts less than) the magnitudes of the expected output voltages of the DUT, so that the DUT normally drives a small amount of current into the clamp at its maximum and minimum excursions. When a DUT with a source impedance of less than 50 ohms drives this circuit, the waveform at the end of the transmission line tends to overshoot. The overshoot is "shorted out" by one of the clamp diodes. Since the transmission line is terminated by a circuit whose dynamic impedance is less than $Z_0$, a reflection which propagates back to the DUT supplies more energy to the transmission line. This cycle repeats for several times the round-trip delay of the transmission line until the current in the transmission line falls to a negligible value. If the DUT output produces another edge during this time, the comparator in the tester sees the edge superimposed on the ringing. Although the output waveforms observed at the comparator "look good," the timing of the edges seen by the comparator do not correspond exactly to the timing of the edges produced by the DUT.

The "Z-Clamp". U.S. patent application Ser. No. 08/037,507 of Kenneth R. Wilsher entitled "Method and Circuit for Controlling Voltage Reflections on Transmission Lines" (continuation of Ser. No. 07/764,026, filed Sep. 23, 1991) describes alternate transmission line termination clamp circuits. As discussed in the Wilsher patent application, the impedance characteristics of FIG. 1 are approximated with Z-clamp circuits such as shown in FIGS. 2A and 2B. These circuits are similar to the hard clamp, except that a resistor is placed in series with the diodes so that the impedance is equal to 50 ohms when the diodes are conducting. An advantage of this impedance characteristic is that the dynamic impedance of the termination circuit is equal to $Z_0$. Therefore, the current in the transmission line caused by a DUT output transition falls to zero at twice the round-trip delay time of the transmission line ($2*T_d$) after the DUT output transition.

The timing errors of the Z-clamp are similar to those of the hard clamp for pulse widths less than twice the propagation time $T_d$ Of the transmission line. For pulse widths greater than $2*T_d$, the Z-clamp causes negligible timing error, since the current in the transmission line caused by the first edge has dropped to zero by the time the second edge occurs.

When the DUT is an ECL or a GTL circuit or any circuit that is designed to drive into a terminated transmission line, it is ideal to terminate the transmission line between the DUT and its associated comparator within the tester by connecting a fixed resistor with a value of $Z_0$ between the end of the transmission line and a low impedance voltage source that is set to the appropriate voltage. If the actual circuit that is connected to the end of the transmission line has an equivalent circuit that is different from this ideal, reflections and therefore timing measurement errors will occur.

The clamp circuits proposed in Wilsher's U.S. patent application Ser. No. 08/037,507 do not address the condition described in the previous paragraph. The circuits shown in FIGS. 2A and 2B (corresponding to FIGS. 5A and 5B of Wilsher's application) would serve adequately if Wilsher's voltage $(V_{cc}-V_d)$ were reprogrammed to $(V_t-V_d)$ and if Wilsher's voltage $V_d$ were reprogrammed to $(V_t+V_d)$, where $V_t$ is the termination voltage and $V_d$ is the diode-junction voltage drop. However, voltages $(V_t-V_d)$ and $(V_t+V_d)$ would have to be carefully controlled and coordinated with the actual value of $V_d$ at the prevailing temperature, to prevent excess current from flowing from the node at voltage $(V_t+V_d)$ through diodes D1 and D2 to the node at $(V_t-V_d)$.

Source-Terminating the Transmission Line. This can be accomplished by either of two methods, assuming that the transmission lines in the tester have a characteristic impedance of 50 ohms, which appears to be a de facto standard. One method is to design the DUT output drivers to have a source impedance of 50 ohms when driving either high or low. The other method is to design the DUT output drivers to have the same impedance when driving either high or low, but less than 50 ohms. In the latter case, a resistor must be added to the test fixture near the DUT so that the total impedance driving the transmission line will be equal to 50 ohms.

Terminating the Tester End of Transmission Line in its Characteristic Impedance. This technique will always produce ideal waveshapes at the tester's comparators. The amplitude of these waveforms will be attenuated:

$$V_{out}=V_s*Z_0/(Z_s+Z_0),$$

where $V_s$ is the voltage and $Z_s$ is the impedance of the DUT's output driver. This attenuation must be considered when calculating the comparison voltages if the device outputs are not terminated in the end-use application.

A disadvantage of this technique is that most existing CMOS output drivers are not designed to drive a terminated transmission line. However, the philosophy of designing high-speed output drivers that cannot drive a terminated transmission line must be questioned. If a device is going to be tested, then it must operate satisfactorily in its test environment(s) as well as in its end-use environment. If a DUT with output impedance $Z_s$ drives an unterminated 50 ohm transmission line in the test environment of length $T_d$ and the DUT switches between voltages $V_{oh}$ and $V_{ol}$, then the DUT's output must supply a current equal to $(V_{oh}-V_{ol})/(Z_s+50)$ for a period of time equal to $2*T_d$. If the same transmission line is terminated at $(V_{oh}+V_{ol})/2$, then the maximum output current is reduced by 50%. Terminating the tester's transmission line in its characteristic impedance will therefore reduce ground-bounce in the DUT, and even reduce power dissipation at some output frequencies.

The Programmable Load. This circuit has been used since the earliest days of IC testing, when DTL and TTL devices comprised a significant part of the IC market. It was designed to test the outputs of devices that drive DTL and TTL inputs. Such inputs draw DC current from their driving sources. A programmable load typically consists of a Schottky diode bridge, switchable current sources, resistors, and a termination voltage source. When the input signal from the DUT is more negative than the termination voltage, a specified current ($I_{ol}$) is drawn from the DUT by the load. Similarly, a differently specified current ($I_{oh}$) is driven into the DUT from the load whenever the input signal is more positive than the termination voltage. A programmable load is typically used in conjunction with a hard clamp or Z-clamp.

A programmable load compromises the timing accuracy of the tester. The input capacitance of the programmable load reduces the apparent bandwidth of the DUT output signal as observed at the comparator input. And, if a programmable load is "on", the bridge and its current sources look like a "diode+capacitor" load at the end of the transmission line. The diodes are forward-biased whenever the DUT output is at the same state for a significant period of time, but they are reverse-biased by the first edge emanating from the DUT. Subsequent edges that occur soon after the first edge will not drive the same capacitive load as the first edge. The fact that the load changes from edge to edge causes an uncalibratable timing error. The maximum error depends on the stray capacitance of the bridge (i.e., the capacitances of the diodes, current sources, current switches, and the board or module on which they are mounted).

Whether all or some or very little of this error affects the time measurement of a specific edge depends on the time between the edge being measured and the previous edge, the decay time of the bridge's stray capacitance (i.e., the capacitance times the voltage change divided by the programmed current ($I_{oh}$ or $I_{ol}$)), and the calibration technique (i.e., whether the system calibration is based on the first edge or a later edge). Moreover, the maximum programmable load current may not be sufficient to provide adequate termination for the input signal.

If a CMOS IC produces output transitions which are separated in time by less than twice the delay of the transmission lines in its tester environment ($2*T_d$), then good timing accuracy can be achieved only by terminating these transmission lines in their characteristic impedance. This can be achieved either by designing the drive impedance of the IC outputs to be equal to $Z_0$, or by placing resistive terminations near the tester's comparators. Either approach places significant requirements on the IC design. If a CMOS IC produces output transitions that are separated in time by more than $2*T_d$ and less than $4*T_d$ (or even less than $6*T_d$), then a significant advantage in timing accuracy can be achieved by using a Z-clamp instead of a hard clamp. A programmable load should not be used when testing high-speed devices.

SUMMARY OF THE INVENTION

In accordance with the invention, circuits are provided which serve as a driver as well as a termination and clamp. For convenience, such circuits will be referred to as driver circuits. A driver circuit in accordance with the invention has an I/O terminal which is connected to an input, output, or I/O port of a DUT by means of a transmission line. The driver circuit can be operated to perform any of the following functions:

(1) Drive an input or I/O port of the DUT. The driver circuit's I/O terminal is switched between two predetermined voltage levels ($V_H$ and $V_L$) with an output impedance ($Z_0$) that matches the transmission line between the driver circuit and the DUT, for the purpose of driving the DUT port between two predetermined voltage levels ($V_{H'}$ and $V_{L'}$) that are related to $V_H$ and $V_L$. If the DUT end of the transmission line is not terminated, then $V_H=V_{H'}$ and $V_L=V_{L'}$. If the DUT end of the transmission line is terminated by a resistor of value $Z_0$ connected to a voltage source $V_t$, then $V_{H'}=V_H/2+V_t/2$, and $V_{L'}=V_L/2+V_t/2$.

(2) Terminate an output or I/O port of the DUT. One of two methods of termination can be used, depending on the specified characteristics of the DUT's output or I/O port to be terminated.

(a) If the output or I/O port of the DUT is specified as being capable of driving a terminated load, the transmission line between the driver circuit and the DUT is terminated by switching the driver circuit's I/O terminal to a predetermined voltage level ($V_t$) with an impedance of $Z_0$. The driver circuit is programmed to do this whenever the DUT is expected to produce an output signal at the output or I/O port that is connected to the driver circuit.

(b) If the output or I/O port of the DUT is not specified as being capable of driving a terminated load, the driver circuit functions like the Z-clamp circuit described in Wilsher's patent application, in which case the driver circuit has a high output impedance if the voltage at its I/O terminal is between two predetermined voltages ($V_{CH}$ and $V_{CL}$). If the voltage at its I/O terminal is more positive than the high clamp voltage ($V_{CH}$), then the driver circuit will have an output impedance of approximately $Z_0$ to voltage $V_{CH}$. Similarly, if the voltage at the I/O terminal of the driver circuit is more negative than the low clamp voltage ($V_{CL}$), then the driver circuit will have an output impedance of approximately $Z_0$ to voltage $V_{CL}$.

The capability of switching between two predetermined voltage levels is optionally extensible to more than two predetermined voltage levels, or even to two or more outputs of signal generators, which would be appropriate for testing analog or mixed-signal integrated circuits or other devices.

In an automatic tester, a comparator circuit must be connected to the tester end of each transmission line that is connected to a DUT output or I/O port. Many such comparator circuits are well known, and others are being developed. The comparator circuit is preferably located at the tester end of the transmission line, very close to the driver circuit of the present invention. Alternately, the comparator and an inductive "pad" is located on the transmission line between the DUT and the driver circuit. The inductive "pad" would be necessary to neutralize the input capacitance of the comparator, to minimize transmission line reflections that would otherwise be caused by the comparator's input capacitance.

A driver circuit in accordance with the present invention can offer any or all of the following advantages over the prior art:

(1) It does not require a separate circuit for terminating or clamping the transmission line between itself and the DUT, since the driver and the clamp are one and the same circuit.

(2) DUT output signal transitions cannot cause current to flow in the turned-off driver's output stage unless the driver's output voltage is more positive than the "high clamp voltage", or more negative than the "low clamp voltage".

(3) It can adequately sink currents that result from transmission line reflections.

(4) It can be programmed to function like the Z-clamp described in Wilsher's patent application if the DUT outputs are designed to operate in an unterminated environment, or it can be programmed to function like a fixed resistor connected to a low impedance voltage source, if the DUT outputs are designed to operate in a terminated environment.

DESCRIPTION OF THE PREFERRED EMBODIMENTS

Figure 1:
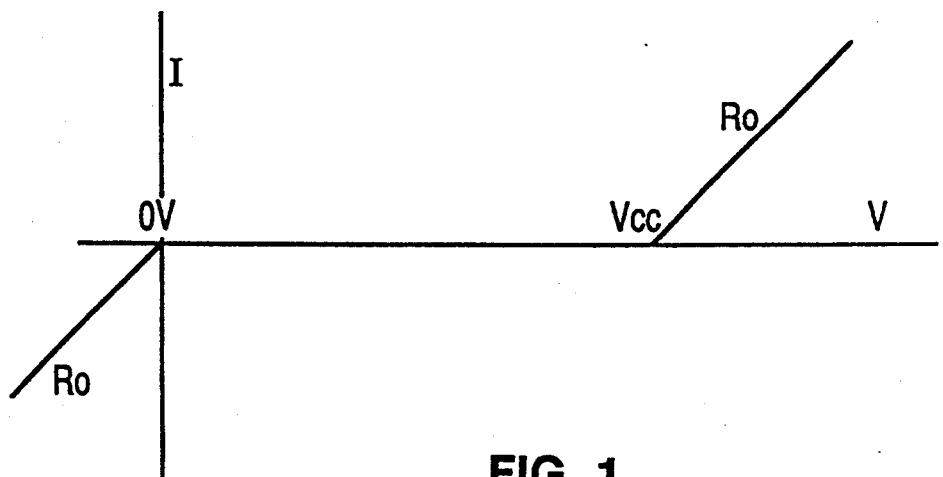
FIG. 1 illustrates the electrical characteristics of a prior-art clamp circuit.
Figure 2A:
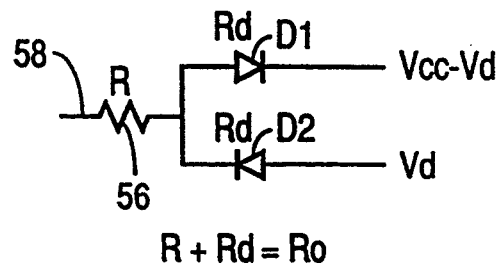
FIGS. 2A and 2B show prior-art circuits for approximating the clamp characteristics of FIG. 1.
Figure 2B:
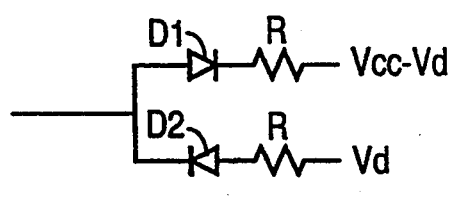
Figure 3:
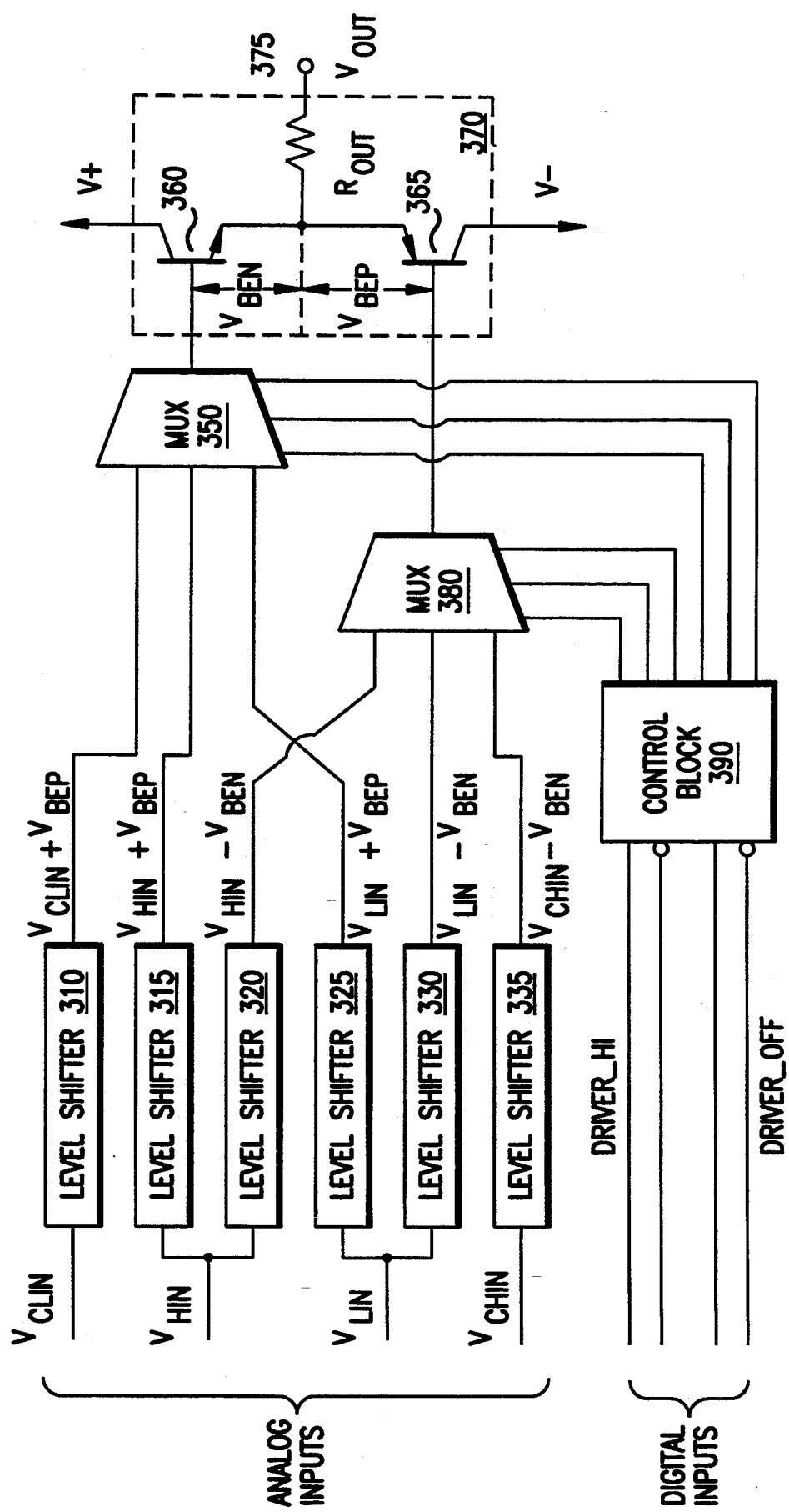
FIG. 3 is a block diagram of a preferred driver circuit in accordance with the present invention.

FIG. 3 shows four analog input signals ($V_{CLIN}$, $V_{HIN}$, $V_{LIN}$, and $V_{CHIN}$), and two digital input control signals (DRIVER_HI and DRIVER_OFF). The analog input signals may be supplied by programmable voltage sources of a test system, and the digital input control signals serve may be supplied by a control processor of a test system. Each of the two digital input control signals is shown as a two-wire connection, since they are typically differential ECL signals.

The analog input signals are coupled to a set of six level shifters 310, 315, 320, 325, 330 and 335. Level shifters 310, 315 and 325 cause respective input signals $V_{CLIN}$, $V_{HIN}$ and $V_{LIN}$ to be shifted positively by a voltage $V_{BEP}$. An analog multiplexer 350 couples a selected one of these three signals to the base of NPN transistor 360 in a complementary bipolar output stage 370.

Level shifters 320, 330 and 335 cause respective input signals $V_{HIN}$, $V_{LIN}$, and $V_{CHIN}$ to be shifted negatively by a voltage $V_{BEN}$. An analog multiplexer 380 couples a selected one of these three signals to the base of PNP transistor 365 in complementary bipolar output stage 370.

The digital input signals are connected to a control block 390 which in turn supplies the signals needed to control the analog multiplexers.

When signals DRIVER_OFF and DRIVER_HI are both false, then output stage 370 resembles an ideal voltage source $V_L$ in series with a source impedance equal to $Z_0$, connected to the output terminal $V_{out}$. This is accomplished by coupling a voltage $V_L+V_{BEN}$ to the base of NPN transistor 360, and coupling a voltage $V_L-V_{BEP}$ to the base of PNP transistor 365, where $V_{BEN}$ is the voltage shift across the base-emitter junction of NPN transistor 360 and $V_{BEP}$ is the voltage shift across the base-emitter junction of PNP transistor 365. Under quiescent conditions, a predetermined current $I_{os}$ flows through output stage 370 from V+ to V−. Output stage 370 then has an output impedance $Z_{os}=(Z_{npn}*Z_{pnp})/Z_{npn}+Z_{pnp})$. In this case, the ideal value for $R_{out}$ is $Z_0-Z_{os}$, so that $Z_{ox}+R_{out}=Z_0$. Output stage transistors 360 and 365 should be quite large, so that they will be able to deliver a high current to the output terminal, and so that $Z_{os}$ will be a small fraction of $Z_0$. Analog multiplexers 350 and 380 are assumed to have a small voltage offset equal to dV. Level shifters 310, 315 and 325 consist of PNP emitter followers which produce a voltage shift of $+V_{BEP}$, assuming that they are operating at the same current density as PNP transistor 365. Level shifters 320, 330 and 335 consist of NPN emitter followers which produce a voltage shift of $-V_{BEN}$, assuming that they are operating at the same current density as NPN transistor 360. Analog input voltage $V_{LIN}$ is chosen so that $V_{LIN}=V_L+V_{BEN}-V_{BEP}-dV$.

Similarly, when DRIVER_OFF is false and DRIVER_HI is true, and analog input voltage $V_{HIN}=V_H+V_{BEN}-V_{BEP}-dV$, then a voltage $V_H+V_{BEN}$ is coupled to the base of NPN transistor 360, and a voltage $V_H-V_{BEP}$ is coupled to the base of PNP transistor 365. Output stage 370 then resembles a voltage source $V_H$ in series with a source impedance equal to $Z_{os}+R_{out}$ connected to the output terminal $V_{out}$.

Similarly, when DRIVER_OFF is true, and DRIVER_HI is either true or false, and if $V_{CLIN}$ and $V_{CHIN}$ are both set equal to $V_t+V_{BEN}-V_{BEP}-dV$, then output stage 370 resembles a voltage source $V_t$ in series with an impedance $Z_0$. If $V_{CHIN}$ is more positive than $V_{CLIN}$, then output stage 370 resembles the Z-clamp described in Wilsher's patent application. If $V_{CHIN}$ is set to $V_{CH}+V_{BEN}-V_{BEP}-dV$, and if $V_{CLIN}$ is set to $V_{CL}+V_{BEN}-V_{BEP}-dV$, then output stage 370 has a high impedance when output terminal 375 is driven by an external circuit to any voltage between $V_{CH}$ and $V_{CL}$.

If output terminal 375 is driven more positive than $V_{CH}$, then PNP transistor 365 conducts current from the output terminal to V−. The output impedance of PNP transistor 365 is $Z_{pnp}$, or approximately $2*Z_{os}$. In this case, the ideal value for $R_{out}$ is $Z_{out}-Z_{pnp}$, or approximately $Z_{out}-(2*Z_{os})$. Note that $Z_{os}$ should be much less than $Z_0$, as described above, so that $Z_{out}$ is dominated by $R_{out}$.

Similarly, if output terminal 375 is driven more negative than $V_{CL}$, then NPN transistor 360 conducts current from V+ to output terminal 375. The output impedance of NPN transistor 360 is $Z_{npn}$, or approximately $2*Z_{os}$. In this case, the ideal value for $R_{out}$ is $Z_{out}-Z_{npn}$, or approximately $Z_{out}-(2*Z_{os})$.

In practice, the chosen value of $R_{out}$ will be a compromise between the value $Z_0-(2*Z_{os})$ and the value of $Z_0-Z_{os}$ described above. Though not illustrated in FIG. 3, resistors may optionally be added to limit current through the emitters of NPN transistor 360 and PNP transistor 365 to prevent thermal runaway. Those of skill in the art will recognize that if such current-limiting resistors are used, their values should be as small as practicable in order to keep the value of $Z_0$ low, and that the voltage shifts imposed by the level shifters should take into account the voltage drops across the current-limiting resistors.

Figure 4:
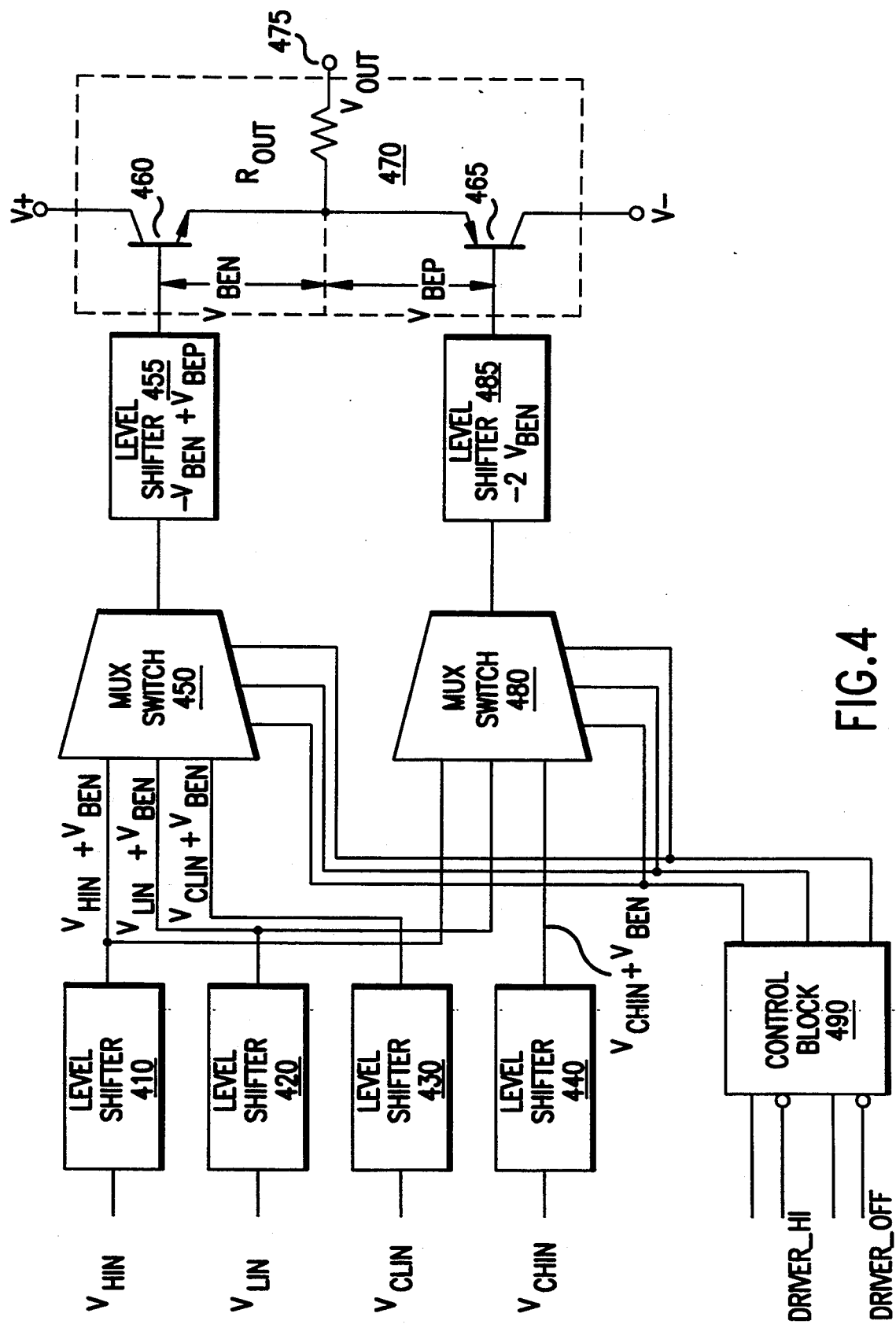
FIG. 4 is a block diagram of another preferred driver circuit in accordance with the present invention.

An alternate driver circuit embodiment is shown in FIG. 4. Supplied to the circuit are analog input signals $V_{CLIN}$, $V_{HIN}$, $V_{LIN}$, and $V_{CHIN}$, and differential digital input signals DRIVER_HI and DRIVER_OFF.

The analog input signals are coupled to a set of four level shifters 410, 420, 430, 440 which cause the respective analog input signals to be shifted positively by a voltage $V_{BEN}$. An analog mux switch 450 couples a selected one of three of these signals ($V_{HIN}+V_{BEN}$, $V_{LIN}+V_{BEN}$, or $V_{CLIN}+V_{BEN}$) to a level shifter 455 which applies a voltage shift of $-V_{BEN}+V_{BEP}$ and supplies the thus-shifted signal ($V_{HIN}+V_{BEP}$, $V_{LIN}+V_{BEP}$, $V_{CLIN}+V_{BEP}$, respectively) to the base of NPN transistor 460 in a complementary bipolar output stage 470.

Similarly, an analog mux switch 480 couples a selected one of three of these signals ($V_{HIN}+V_{BEN}$, $V_{LIN}+V_{BEN}$, or $V_{CHIN}+V_{BEN}$) to a level shifter 485 which applies a voltage shift of $-2V_{BEN}$ and supplies the thus-shifted signal ($V_{HIN}-V_{BEN}$, $V_{LIN}-V_{BEN}$, or $V_{CHIN}-V_{BEN}$, respectively) to the base of NPN transistor 465 in output stage 470.

Mux switches 450 and 480 are preferably implemented in a manner which will be described below with reference to FIGS. 5 and 6. Ideally, mux/switches 450 and 480 should not introduce a voltage shift, though the discussion below assumes that in practice each of them will introduce a minimal voltage shift dV. The digital input signals are provided to a control block 490 which supplies control signals to analog mux switches 450 and 480.

Operation is similar to that of the embodiment of FIG. 3. When signals DRIVER_OFF and DRIVER_HI are both false, output stage 470 resembles an ideal voltage source $V_L$ in series with a source impedance equal to $Z_0$, connected to the output terminal $V_{out}$. This is accomplished by coupling a voltage $V_L+V_{BEP}$ to the base of NPN transistor 460, and coupling a voltage $V_L-V_{BEN}$ to the base of PNP transistor 465. Under quiescent conditions, a predetermined current $I_{os}$ flows through output stage 470 from V+ to V−. Output stage 470 then has an output impedance $Z_{os}=(Z_{npn}*Z_{pnp})/(Z_{npn}+Z_{pnp})$. In this case, the ideal value for $R_{out}$ is $Z_0-Z_{os}$, so that $Z_{os}+R_{out}=Z_0$. Output stage transistors 460 and 465 should be large, so that they can deliver a high current to the output terminal and so that $Z_{os}$ will be a small fraction of $Z_0$. Analog multiplexers 450 and 480 are preferably implemented as described below with reference to FIGS. 5 and 6, so that they introduce no voltage shift. Level shifters 410-440 comprise NPN emitter followers which produce a voltage shift of $+V_{BEN}$. Level shifter 455 produces a voltage shift of $-V_{BEN}+V_{BEP}$. Level shifter 485 produces a voltage shift of $-2V_{BEN}$. Analog input voltage $V_{LIN}$ is chosen so that $V_{LIN}=V_L+V_{BEN}-V_{BEP}-dV$.

When DRIVER_OFF is false and DRIVER_HI is true, and analog input voltage $V_{HIN}=V_H+V_{BEN}-V_{BEP}-dV$, then a voltage $V_H+V_{BEN}$ is coupled to the base of NPN transistor 460, and a voltage $V_H-V_{BEP}$ is coupled to the base of PNP transistor 465. Output stage 470 then resembles a voltage source $V_H$ in series with a source impedance equal to $Z_{os}+R_{out}$ connected to the output terminal $V_{out}$.

When DRIVER_OFF is true, and DRIVER_HI is either true or false, and if $V_{CLIN}=V_{CHIN}=V_t+V_{BEN}-V_{BEP}-dV$, then output stage 470 resembles a voltage source $V_t$ in series with an impedance $Z_0$. If $V_{CHIN}$ is more positive than $V_{CLIN}$, then output stage 470 resembles Wilsher's Z-clamp. If $V_{CHIN}$ is set to $V_{CH}+V_{BEN}-V_{BEP}-dV$, and if $V_{CLIN}$ is set to $V_{CL}+V_{BEN}-V_{BEP}-dV$, then output stage 470 has a high impedance when output terminal 475 is driven by an external circuit to any voltage between $V_{CH}$ and $V_{CL}$.

If output terminal 475 is driven more positive than $V_{CH}$, then PNP transistor 465 conducts current from the output terminal to V−. The output impedance of PNP transistor 465 is $Z_{pnp}=2*Z_{os}$. In this case, the ideal value for $R_{out}=Z_{out}-Z_{pnp}\approx Z_{out}-(2*Z_{os})$.

If output terminal 475 is driven more negative than $V_{CL}$, then NPN transistor 460 conducts current from V+ to output terminal 475. The output impedance of NPN transistor 460 is $Z_{npn}=2*Z_{os}$. In this case, the ideal value for $R_{out}=Z_{out}-Z_{npn}\approx Z_{out}-(2*Z_{os})$. In practice, the chosen value of $R_{out}$ will be a compromise between the values $Z_0-(2*Z_{os})$ and $Z_0-Z_{os}$. Though not illustrated in FIG. 4, resistors may optionally be added to limit current through the emitters of NPN transistor 460 and PNP transistor 465 to prevent thermal runaway. Those of skill in the art will recognize that if such current-limiting resistors are used, their values should be as small as practicable in order to keep the value of $Z_0$ low, and that the voltage shifts imposed by the level shifters should take into account the voltage drops across the current-limiting resistors.

Driver Mux/Switch. ATE pin drivers are essentially pulse generators with programmable levels. They consist in general of an output buffer (e.g., buffer 470) and one or more voltage switches (e.g., 450, 480) which, under digital control, select one of a plurality of programmable DC input signals. Traditional pin drivers have two input levels and two-way mux/switches. The pin driver architecture described above with reference to FIGS. 3 and 4 requires 3-way mux/switches. The traditional two-way mux/switch design is not expandable to three-way without introducing major problems. Following is described a novel implementation of a three-way (or N-way, if desired) mux/switch which overcomes some of the problems of the old designs. The described mux/switch topology can be used, for example, in an integrated circuit design.

Figure 5:
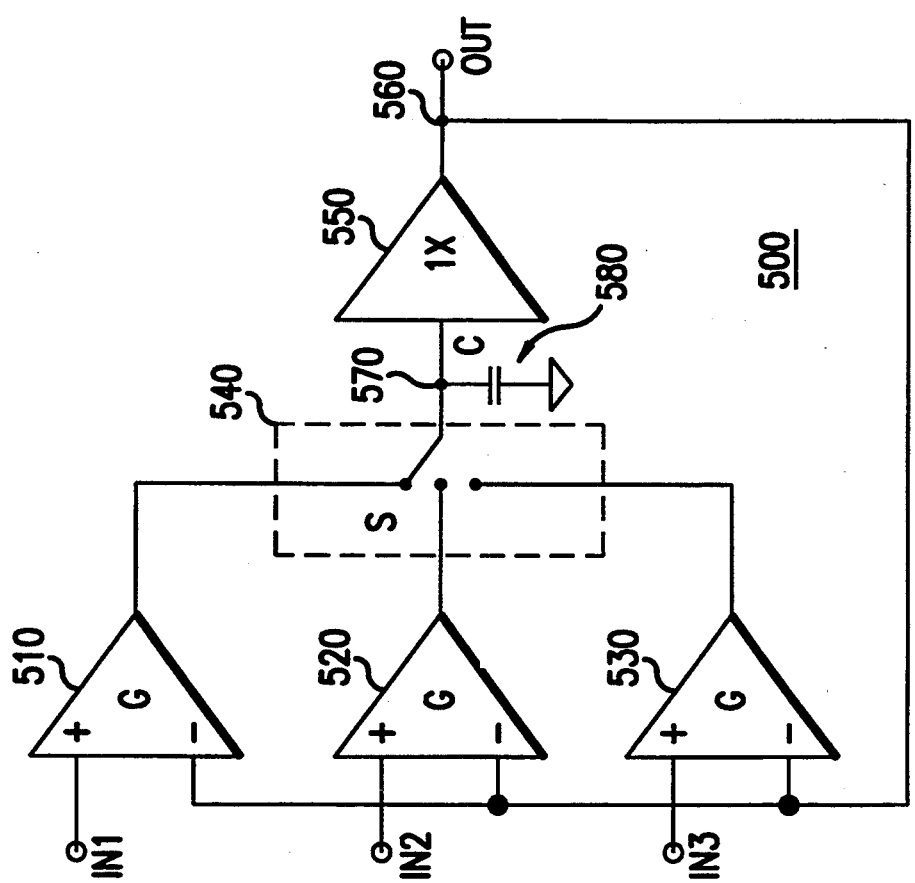
FIG. 5 is a block diagram of a preferred mux/switch in accordance with the present invention.

FIG. 5 shows a block diagram of a three-way mux/switch 500, though the design can be generalized to N-way. Mux/switch 500 can be described as a switched-input feedback amplifier. It comprises three transconductance differential input stages 510, 520 and 530, where each of positive input lines IN1, IN2 and IN3 is connected to receive a corresponding one of the input DC voltage levels, a current-mode switch 540 and a buffer such as unity-gain buffer 550. (Buffer 550 need not be of unity gain, but may be so for convenience.) The negative inputs of input stages 510, 520 and 530 are all connected to receive the output signal of switch 540 from the output line 560 of unity-gain buffer 550. Input node 570 of the unity-gain buffer is a high impedance node. The capacitor 580 of value C shown in FIG. 5 is the sum of the active device capacitances and wiring capacitances; it is shown here because it is critical in determining the slew rate of the mux/switch and it has to be kept to a minimum value possible. The described mux/switch can be implemented using a fast complementary bipolar IC process. In such a process, it is easier to implement a fast current switch than a good voltage switch. The described topology thus implements a voltage switch based on using a current switch.

Operation of mux/switch 500 is based on a negative feedback loop. Each time current switch 540 selects a different input, the appropriate input amplifier switched in, being unbalanced, drives some current into capacitor 580. The voltage at output node 560 starts changing so as to make the imbalance smaller. After settling, the voltage at output node 560 is equal to the voltage at the DC input line of the input stage whose output is selected by current switch 540 (except for voltage offsets in the circuit). The amplifier is then balanced and no current flows from its output into the capacitor 580. The slew rate of output node 560 of the mux/switch depends on the value C of capacitance 580 and the output current capability of the transconductance input amplifier stages 510, 520 and 530.

Figure 6:
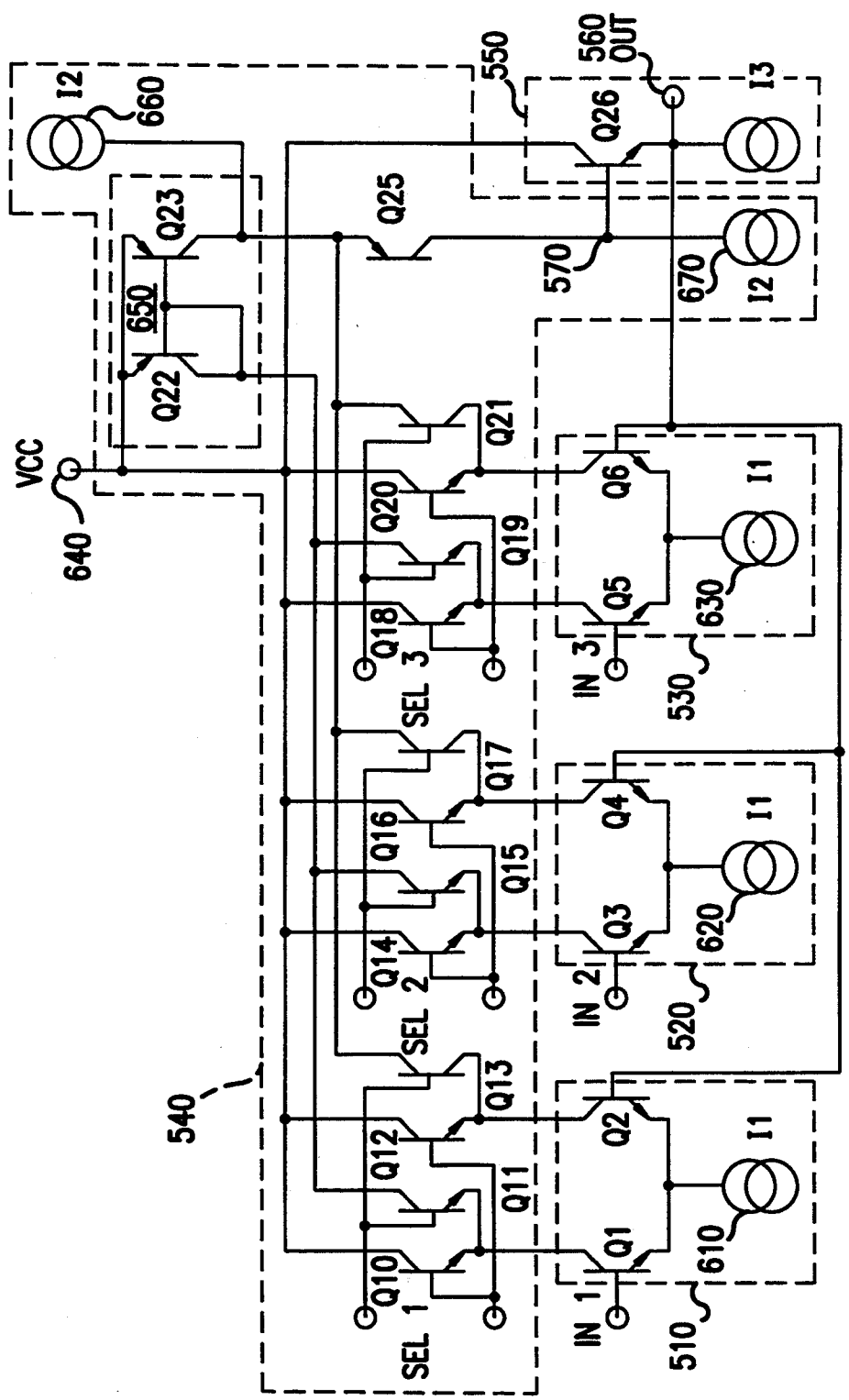
FIG. 6 is a simplified schematic of a preferred mux/switch in accordance with the present invention.

A simplified schematic of the mux/switch of FIG. 5 is shown in FIG. 6. For simplicity of illustration, transistor Q25 is shown without base but is assumed to be connected in a common-base configuration. The differential input stages 510, 520 and 530 for receiving respective DC-level input signals IN1, IN2 and IN3 are formed by respective transistor pairs Q1-Q2, Q3-Q4 and Q5-Q6. Each transistor pair is supplied with bias current of magnitude I1 from one of current sources 610, 620 and 630. Switch 540 is a differential current switch comprising transistors Q10 through Q21, where SEL1, SEL2 and SEL3 are the digital control input lines to the switch.

The output currents of the two unselected input amplifiers go to the power supply at voltage $V_{CC}$ via node 640. The differential output current of the selected input amplifier is converted to single-ended by a current mirror 650 comprised of transistors Q22-Q23. Assume, for example, that the output signal from input stage 510 is selected by setting digital control signal SEL1 such that transistors Q11 and Q13 are conducting, and that the output signals from input stages 520 and 530 are not selected. In this case, the differential output currents of transistor pairs Q3-Q4 and Q5-Q6 go to the power supply via transistors Q14/Q16 and Q18/Q20, respectively. The collector current of transistor Q2 is supplied via transistor Q13 to the emitter of transistor Q25, and the collector current of transistor Q1 is supplied via transistor Q11 to the collector of current-mirror transistor Q22. Since the collector of transistor Q22 is tied to the bases of transistors Q22 and Q23, forcing current into the collector of transistor Q22 causes the collector currents of transistors Q22 and Q23 to be of approximately equal magnitude and of opposite direction.

Current source 660 supplies a current of magnitude I2, needed to keep transistor Q25 always turned on. This current is subtracted at low-capacitance node 570 from a current supplied from a current source 670 of magnitude I2 but opposite polarity. For Q25 to stay turned on, current magnitude I2 must be greater than current magnitude I1. The resulting single-ended current through transistor Q25 thus has a range of I2+I1 to I2−I1. The magnitude of the emitter current of common-base transistor Q25 is therefore approximately equal to the difference of the collector currents of transistors Q1 and Q2.

The current through transistor Q25 is fed to low-capacitance node 570 of the circuit. Low-capacitance node 570 is tied to the base of transistor Q26 of output buffer 550. Transistor Q26 is preferably biased with a current I3 as illustrated, though other suitable biasing could also be used, such as a resistor to a negative voltage source.

The output of current switch 540 has relatively high capacitance due to the number of transistors connected to it. This mandates the use of transistor Q25 to keep the capacitance of note 570 low and thereby keep the slew rate of the mux/switch circuit high. The total capacitance of node 570 is the sum of the capacitances of the transistors connected to it: transistors Q25 and Q26 and the output transistor (not illustrated) of current source 670.

Conventional test system elements to which a driver circuit in accordance with the invention may be connected in the test environment, such as programmable voltage sources, the digital input control signal source, the transmission line and DUT, comparators, etc., are not shown in the interest of clarity of illustration. Those of skill in the art will understand from the foregoing description how to employ driver circuits embodying the concepts of the present invention in a test system.

Those of skill in the art will also recognize that the embodiments shown and described above are merely illustrative of the invention and can be modified in a variety of ways without departing from the spirit and scope of the invention as defined by the following claims. For example, the level shifters provided to compensate for voltage shifts resulting in the specific embodiments discussed above could be implemented differently or their functions carried out differently. Voltage shifts occurring in the driver circuit due to temperature variations or other causes can be readily compensated by calibration of the driver circuit, such as by monitoring the actual output voltage, comparing with the desired output voltage, and then changing the programmable input voltage until the actual output voltage matches the desired output voltage.

We claim:

1. A driver circuit for connection to a device under test by a transmission line in an IC tester, comprising:
   a. a controllable switching stage having signal input lines for receiving a plurality of analog signals and switching circuitry responsive to digital control signals for supplying to a first driver input line a selected one of the analog signals and for supplying to a second driver input line a selected one of the analog signals,
   b. a push-pull driver circuit having a first driver input line, a second driver input line, and a driver I/O port having a functional characteristic determined by the analog signals supplied to the first driver input line and to the second driver input line such that
      i. the driver I/O port can be switched between two predetermined voltage levels ($V_H$ and $V_L$) with a predetermined output impedance ($Z_0$) for driving a port of a device under test over a transmission line of impedance $Z_0$,
      ii. the driver I/O port can be switched to a predetermined voltage level ($V_t$) with an impedance of $Z_0$ for terminating a transmission line of impedance $Z_0$ driven by a device under test, and
      iii. the driver I/O port can be switched to clamp a transmission line of impedance $Z_0$ driven by a device under test, by presenting a high output impedance when the voltage applied to the driver I/O port is between a high clamp voltage and a low clamp voltage, by presenting an output impedance of approximately $Z_0$ to the high clamp voltage when voltage at the driver I/O port is more positive than the high clamp voltage, and by presenting an output impedance of approximately $Z_0$ to the low clamp voltage when voltage at the driver I/O port is more negative than the low clamp voltage.

2. The driver circuit of claim 1, wherein the output stage comprises an NPN transistor, a PNP transistor, and a resistor ($R_{OUT}$), the NPN transistor having a base comprising the first driver input line, the PNP transistor having a base comprising the second driver input line, and wherein the emitters of said transistors are coupled to a junction to form a push-pull driver, and wherein said junction is coupled to the driver I/O port through said resistor.

3. The driver circuit of claim 2, wherein said switching circuitry comprises a switched-input feedback amplifier having transconductance differential input stages (510, 520, 530) with respective first input lines for receiving respective analog input signals and respective second input lines for receiving a switch output signal, a buffer (550) having a buffer input line and a buffer output line, a current-mode switch (540) for coupling a differential current signal from one of the input stages to the buffer input line, and a feedback line for supplying a switch output signal from the buffer output line to said second input lines.

4. The driver circuit of claim 3, wherein the buffer input line has a capacitance which is primarily determined by the sum of capacitances of active devices connected to the buffer input line and wiring capacitances, and wherein said capacitance is minimized by connecting no more than three active devices to the input buffer line.

5. A driver circuit useful as a driver and as a termination and clamp, comprising:
 a. an I/O terminal for connection to a port of a device under test through a transmission line having a characteristic impedance $Z_0$;
 b. means for switching the I/O terminal between predetermined voltage levels $V_H$ and $V_L$ with an output impedance $Z_0$ for driving the port between two predetermined voltage levels $V_{H'}$ and $V_{L'}$, such that $V_{H+}=V_{L'}=V_L$ when the transmission line is not terminated at the port, and such that $V_{H'}=V_H/2+V_t/2$ and $V_{L+}=V_L/2+V_t/2$ when the transmission line is terminated at the device under test by a resistor of value $Z_0$ connected to a voltage source $V_t$;
 c. means for terminating the transmission line by switching the I/O terminal to a predetermined voltage level $V_t$ with an impedance of $Z_0$ when the port is capable of driving a terminated load and is expected to produce an output signal; and
 d. means for presenting a high output impedance at the I/O terminal when the I/O terminal is driven by a port not capable of driving a terminated load to a voltage between a predetermined high clamp voltage $V_{CH}$ and a predetermined low clamp voltage $V_{CL}$, an output impedance of approximately $Z_0$ to voltage $V_{CH}$ when the I/O terminal is driven to a voltage more positive than voltage $V_{CH}$, and an output impedance of approximately $Z_0$ to voltage $V_{CL}$ when the I/O terminal is driven to a voltage more negative than $V_{CL}$.

6. A method of operating a driver circuit as a driver as well as a termination and clamp, the driver circuit having an I/O terminal for connection to a port of a device under test through a transmission line having a characteristic impedance $Z_0$, comprising the steps of:
 a. switching the I/O terminal between predetermined voltage levels $V_H$ and $V_L$ with an output impedance $Z_0$ for driving the a port of a device under test between two predetermined voltage levels $V_{H'}$ and $V_{L'}$, such that $V_{H'}=V_H$ and $V_{L'}=V_L$ when the transmission line is not terminated at the port, and such that $V_{H'}=V_H/2+V_t/2$ and $V_{L'}=V_L/2+V_t/2$ when the transmission line is terminated at the device under test by a resistor of value $Z_0$ connected to a voltage source $V_t$;
 b. terminating the transmission line by switching the I/O terminal to a predetermined voltage level Vt with an impedance of $Z_0$ when the port is capable of driving a terminated load and is expected to produce an output signal; and
 d. presenting a high output impedance at the I/O terminal when the I/O terminal is driven by a port not capable of driving a terminated load to a voltage between a predetermined high clamp voltage $V_{CH}$ and a predetermined low clamp voltage $V_{CL}$, an output impedance of approximately $Z_0$ to voltage $V_{CH}$ when the I/O terminal is driven to a voltage more positive than voltage $V_{CH}$, and an output impedance of approximately $Z_0$ to voltage $V_{CL}$ when the I/O terminal is driven to a voltage more negative than $V_{CL}$.

7. An N-way multiplex switch circuit, comprising:
 a. a transconductance differential input stage (510, 520, 530) for each of N input channels, each input stage having an input line (IN1, IN2, IN3) for receiving a corresponding input voltage, a feedback line for receiving a feedback signal, and an output line;
 b. a buffer (550) having a buffer input line and a buffer output line, the buffer output line connected to the feedback line of each of the input stages; and
 c. a controllable current-mode switch (540) responsive to differential selection signals (SEL1, SEL2, SEL3) for connecting the output line of a selected input stage to the buffer input line.

* * * * *